(12) United States Patent
Lee (10) Patent No.: US 10,886,449 B2
(45) Date of Patent: Jan. 5, 2021

(54) SEMICONDUCTOR DEVICE PACKAGE

(71) Applicant: LG INNOTEK CO., LTD., Seoul (KR)

(72) Inventor: Koh Eun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/426,385

(22) Filed: May 30, 2019

(65) Prior Publication Data

US 2019/0371991 A1   Dec. 5, 2019

(30) Foreign Application Priority Data

May 31, 2018   (KR) .......................... 10-2018-0062937

(51) Int. Cl.
| | |
|---|---|
| *H01L 33/64* | (2010.01) |
| *H01L 33/48* | (2010.01) |
| *H01L 33/62* | (2010.01) |

(52) U.S. Cl.
CPC ............ *H01L 33/64* (2013.01); *H01L 33/483* (2013.01); *H01L 33/62* (2013.01)

(58) Field of Classification Search
CPC ........... H01L 2933/0033; H01L 33/483; H01L 33/486; H01L 33/62; H01L 33/64
See application file for complete search history.

(56) References Cited

U.S. PATENT DOCUMENTS

| | | | |
|---|---|---|---|
| 2012/0241797 A1* | 9/2012 | Kim ...................... | H01L 33/505 |
| | | | 257/98 |
| 2014/0084322 A1* | 3/2014 | Park ...................... | H01L 33/486 |
| | | | 257/98 |

(Continued)

*Primary Examiner* — Julio J Maldonado
*Assistant Examiner* — Mohammad A Rahman
(74) *Attorney, Agent, or Firm* — Ked & Associates LLP (57) ABSTRACT

Disclosed herein is a semiconductor device package including: a body including a cavity; a semiconductor device disposed in the cavity; a light transmitting member disposed on the cavity; and an adhesive layer which fixes the light transmitting member to the body, wherein the cavity includes a stepped portion on which the light transmitting member is disposed, the stepped portion includes a first bottom surface and a third bottom surface spaced apart from each other in a first direction, a second bottom surface and a fourth bottom surface spaced apart from each other in a second direction perpendicular to the first direction, a first connecting portion in which the first bottom surface and the second bottom surface are connected to each other, a second connecting portion in which the second bottom surface and the third bottom surface are connected to each other, a third connecting portion in which the third bottom surface and the fourth bottom surface are connected to each other, and a fourth connecting portion in which the fourth bottom surface and the first bottom surface are connected to each other, the adhesive layer includes a first edge portion, a second edge portion, a third edge portion, and a fourth edge portion respectively—disposed on the first to fourth connecting portions and a first extending portion disposed between the first edge portion and the second edge portion, and the first extending portion has a width which is decreased in a direction toward a center between the first edge portion and the second edge portion.

19 Claims, 11 Drawing Sheets

(56) References Cited

U.S. PATENT DOCUMENTS

2017/0256675 A1* 9/2017 Choi ................. H01L 33/20
2018/0190553 A1* 7/2018 Lin .................. H01L 21/50

* cited by examiner

SEMICONDUCTOR DEVICE PACKAGE

CROSS-REFERENCE TO RELATED APPLICATION(S)

This application claims priority under 35 U.S.C. § 119 to Korean Application No. 10-2018-0062937, filed on May 31, 2018, whose entire disclosure is hereby incorporated by reference.

BACKGROUND

1. Field of the Invention

The present disclosure relates to a semiconductor device package.

2. Discussion of Related Art

Since semiconductor devices including compounds, such as GaN and AlGaN, have many advantages in that energy band gaps are wide and easy to adjust, the semiconductor devices can be variously used for light-emitting devices, light receiving devices, various diodes, and the like.

Particularly, the light-emitting devices such as light-emitting diodes and laser diodes using III-V or II-VI compound semiconductor materials can express various colors such as red, green, and blue and emit ultraviolet light as thin film growth technologies and device materials are developed, can emit high efficiency white light when phosphors are used or colors are mixed, and have advantages in low power consumption, semi-permanent lifespan, quick response time, safety, and eco-friendliness when compared to conventional light sources such as fluorescent tubes and incandescent lamps.

In addition, when the light receiving devices such as a photodetector or a solar cell are manufactured using III-V or II-VI compound semiconductor materials, since the light receiving devices absorb light in various wavelength ranges to generate a current due to developed device materials, light in various wavelength ranges from a gamma ray range to a radio frequency range can be used. In addition, the light receiving devices can be easily used for power control, microwave circuits, or communication modules due to their advantages in quick response time, safety, eco-friendliness, and easy adjustment of the device materials.

Therefore, applications of the semiconductor devices are being widened to receiving modules of optical communications, light-emitting diode backlights substituting for cold cathode fluorescence lamps (CCFL) forming backlights of liquid crystal display (LCD) devices, white light-emitting diode lighting devices substituting for fluorescent tubes and incandescent lamps, vehicle head lights, traffic lights, and sensors configured to detect gas or fire. In addition, applications of the semiconductor devices can be widened to high frequency application circuits, other power control apparatuses, and communication modules.

Particularly, the light-emitting device emitting light of an ultraviolet wavelength band can perform a curing or sterilizing action and can be used for curing, medical, and sterilizing purposes.

SUMMARY OF THE INVENTION

The present disclosure is directed to providing a semiconductor device package with high heat dissipation.

The present disclosure is also directed to providing a semiconductor device package capable of adjusting internal air pressure.

Objectives to be solved by embodiments are not limited to the above-described objectives and will include objectives and effectives which can be identified by solutions for the objectives and the embodiments described below.

According to an aspect of the present disclosure, there is provided a semiconductor device package including: a body including a cavity; a semiconductor device disposed in the cavity; a light transmitting member disposed on the cavity; and an adhesive layer which fixes the light transmitting member to the body, wherein the cavity includes a stepped portion on which the light transmitting member is disposed, the stepped portion includes a first bottom surface and a third bottom surface spaced apart from each other in a first direction, a second bottom surface and a fourth bottom surface spaced apart from each other in a second direction perpendicular to the first direction, a first connecting portion in which the first bottom surface and the second bottom surface are connected to each other, a second connecting portion in which the second bottom surface and the third bottom surface are connected to each other, a third connecting portion in which the third bottom surface and the fourth bottom surface are connected to each other, and a fourth connecting portion in which the fourth bottom surface and the first bottom surface are connected to each other, the adhesive layer includes a first edge portion, a second edge portion, a third edge portion, and a fourth edge portion respectively disposed between the first edge portion and the second edge portion, and the first extending portion has a width which is decreased in a direction from the first edge portion toward a center between the first edge portion and the second edge portion.

The first to fourth bottom surfaces may include outer edges formed by a side surface of the stepped portion and inner edges formed by a sidewall of the cavity, and the first extending portion may be spaced apart from the outer edge or inner edge in a direction toward the center between the first edge portion and the second edge portion.

The adhesive layer may include a separation section which is formed at least one of positions between the first edge portion and the second edge portion, between the second edge portion and the third edge portion, between the third edge portion and the fourth edge portion, and between the fourth edge portion and the first edge portion.

The stepped portion may include a first side surface and a third side surface which face each other, a second side surface and a fourth side surface which face each other, and a plurality of divided regions divided by a first virtual line which passes through a center of the first side surface and a center of the third side surface and a second virtual line which passes through a center of the second side surface and a center of the fourth side surface, the divided regions may include a first divided region including the first side surface and the second side surface, a second divided region including the second side surface and the third side surface, a third divided region including the third side surface and the fourth side surface, and a fourth divided region including the fourth side surface and the first side surface, and the adhesive layer may include a first adhesive layer, a second adhesive layer, a third adhesive layer, and a fourth adhesive layer which are divided from each other, wherein the first adhesive layer may be disposed in the first divided region, the second adhesive layer may be disposed in the second divided region, the third adhesive layer may be disposed in the third divided region, and the fourth adhesive layer may be is disposed in the fourth divided region.

The stepped portion may include a recess which extends toward a corner disposed between side surfaces of the body.

The adhesive layer may include an outer side portion which extends from a portion between the stepped portion and the light transmitting member toward the recess.

The body may include a first conductive portion, a second conductive portion, and a first insulating portion disposed between the first conductive portion and the second conductive portion.

The body may include a second insulating portion disposed in a region formed by a lower surface and a side surface of the body.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which.

DETAILED DESCRIPTION OF EXEMPLARY EMBODIMENTS

Embodiments of the present disclosure may be modified into different forms or the plurality of embodiments may be combined, and the scope of the present disclosure is not limited to the embodiments which will be described below.

Although a description given in a specific embodiment is not given in other embodiments, the description may be understood to be descriptions of other embodiments as long as there are no opposite or inconsistent descriptions given.

For example, when a feature of an element A is described in a specific embodiment and a feature of an element B is described in another embodiment, the scope of the present disclosure includes an embodiment in which the elements A and B are combined even when the embodiment is not clearly described as long as there are no opposite or inconsistent descriptions given.

In a description of the embodiment, in a case in which any one element is described as being formed on or under another element, such a description includes both a case in which the two elements are formed to be in direct contact with each other and a case in which the two elements are in indirect contact with each other such that one or more other elements are interposed between the two elements. In addition, in a case in which one element is described as being formed on or under the other element, such a description may include a case in which one element is formed at an upper side or a lower side with respect to another element.

Hereinafter, embodiments of the present disclosure will be described in detail with reference to the accompanying drawings so that those skilled in the art may easily perform the present disclosure.

Figure 1:
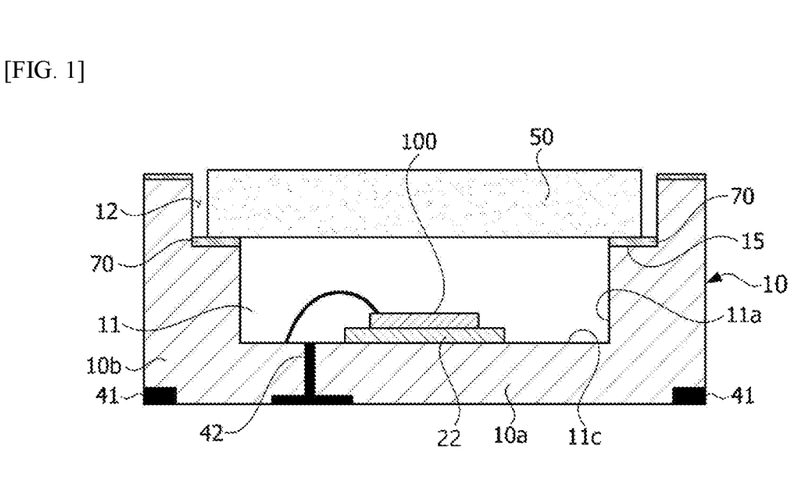
FIG. 1 is a cross-sectional view illustrating a semiconductor device package according to a first embodiment of the present disclosure.
Figure 2:
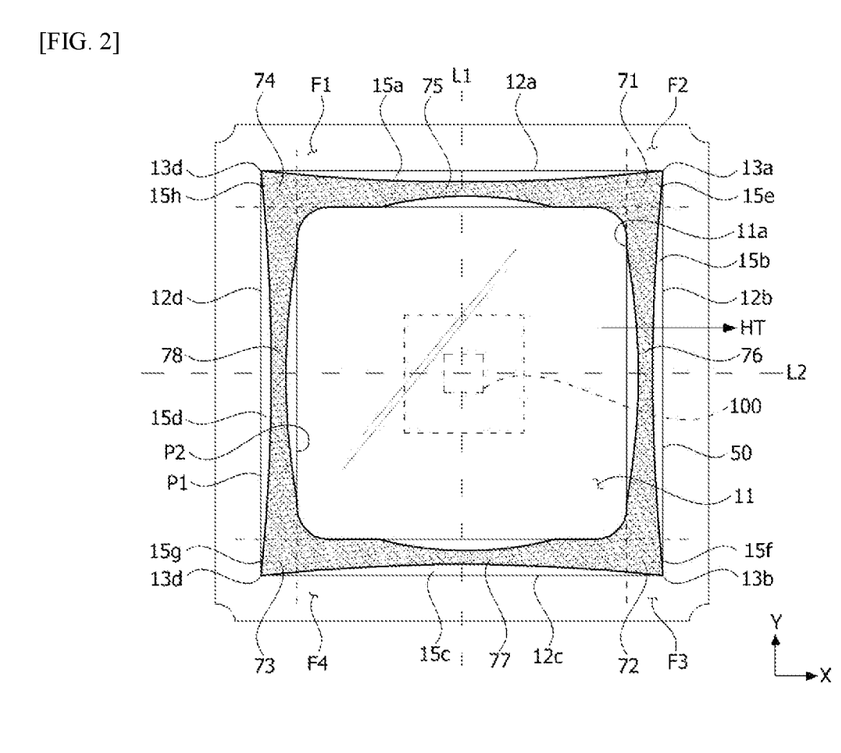
FIG. 2 is a plan view illustrating the semiconductor device package according to the first embodiment of the present disclosure.
Figure 3:
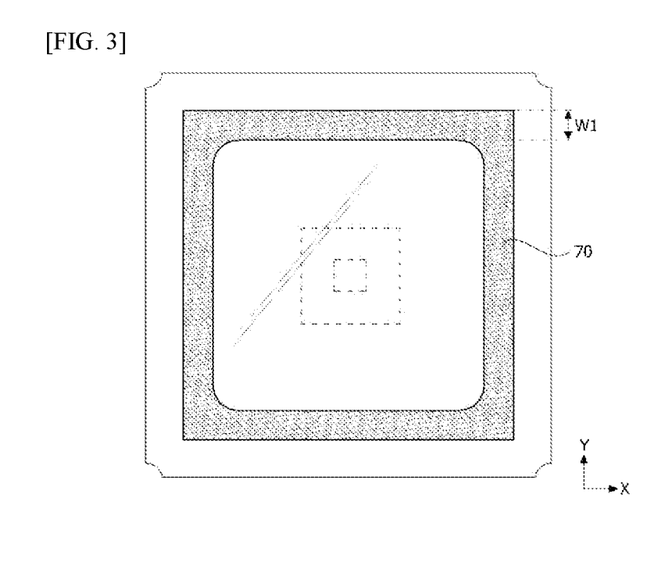
FIG. 3 is a plan view illustrating the semiconductor device package in which a light transmitting member and a stepped portion are entirely bonded.

FIG. 1 is a cross-sectional view illustrating a semiconductor device package according to a first embodiment of the present disclosure, FIG. 2 is a plan view illustrating the semiconductor device package according to the first embodiment of the present disclosure, and FIG. 3 is a plan view illustrating the semiconductor device package in which a light transmitting member and a stepped portion are entirely bonded.

Referring to FIG. 1, the semiconductor device package according to the embodiment may include a body 10 including a cavity 11, a semiconductor device 100 disposed in a cavity 11, and a light transmitting member 50 disposed on the cavity 11.

The body 10 may be manufactured by processing an aluminum substrate. Accordingly, both of an inner surface and an outer surface of the body 10 according to the embodiment may have conductivity. Such a structure may have various advantages. In a case in which a nonconductive material, such as AlN or Al2O3, is used for the body 10, since a reflectivity thereof in an ultraviolet wavelength band ranges only from 20% to 40%, there is a problem in that a separate reflective member should be disposed. In addition, a separate conductive member, such as a lead frame and a circuit, may be necessary. Accordingly, manufacturing costs may be increased and a manufacturing process may become complex. In addition, a conductive member such as gold (Au) has a problem of absorbing ultraviolet light so that light extraction efficiency is decreased.

However, according to the embodiment, when the body 10 is formed of aluminum, since a reflectivity thereof is high in the ultraviolet wavelength band, a reflective member may be omitted. In addition, since the body 10 itself has conductivity, a separate circuit pattern and a lead frame may be omitted. In addition, since the body 10 is formed of aluminum, the body 10 has a high thermal conductivity ranging from 140 W/m·K to 160 W/m·K. Accordingly, heat dissipation efficiency can also be increased.

The body 10 may include a first conductive portion 10a and a second conductive portion 10b. A first insulating portion 42 may be disposed between the first conductive portion 10a and the second conductive portion 10b. Since both of the first conductive portion 10a and the second conductive portion 10b have conductivity, the first insulating portion 42 should be disposed to separate poles.

The first insulating portion 42 may include any material having an insulating function. For example, a material of the first insulating portion 42 may be selected from among an epoxy molding compound (EMC), white silicone, a photo-imageable solder resist (PSR), a silicone resin composition, a modified epoxy resin composition such as a silicone modified epoxy resin, a modified silicone resin composition such as an epoxy modified silicone resin, a polyimide resin composition, a modified polyimide resin composition, polyphthalamide (PPA), a resin such as a polycarbonate resin, polyphenylene sulfide (PPS), a liquid crystal polymer (LCP), an acrylonitrile butadiene styrene (ABS) resin, a phenol resin, an acrylic resin, a polybutylene terephthalate (PBT) resin, and the like.

A width of the first insulating portion 42 may range from 10 μm to 100 μm. In a case in which the width is 10 μm or more, the first conductive portion 10a and the second conductive portion 10b may be sufficiently insulated from each other, and in a case in which the width is 100 μm or less, a problem of increasing a size of the package may be solved.

However, a structure of the body 10 is not necessarily limited thereto, and the body 10 may also be manufactured by stacking a plurality of insulating structures such as AlN or Al2O3. In this case, a separate circuit pattern may be provided in the body 10.

A side surface 11a of the cavity 11 may be disposed to be perpendicular to a bottom surface 11c. However, the side surface is not necessarily limited thereto and may be disposed to have an inclination angle of 90° or more with respect to the lower surface and reflect light emitted from the semiconductor device 100 in an upward direction. As described above, since the body 10 is manufactured of aluminum, an inner surface of the cavity 11 may reflect light in an ultraviolet wavelength band even without a separate reflective member.

The semiconductor device 100 may be disposed in the cavity 11. The semiconductor device 100 may be electrically connected to the first conductive portion 10a and the second conductive portion 10b. A submount 22 is disposed in the cavity 11, and the semiconductor device 100 may be disposed on the submount 22 but is not necessarily limited thereto. A pad (not shown) to which a wire is bonded may be disposed on a bottom of the cavity 11.

The semiconductor device 100 may emit light in an ultraviolet wavelength band. For example, the semiconductor device 100 may also emit light in a near ultraviolet wavelength band (UV-A), light in a far ultraviolet wavelength band (UV-B), or light in a deep ultraviolet wavelength band (UV-C). A wavelength range may be determined by a composition ratio of Al in a light-emitting structure.

For example, the light in the deep ultraviolet wavelength band (UV-A) may have a peak wavelength ranging from 320 nm to 420 nm, the light in the far ultraviolet wavelength band (UV-B) may have a peak wavelength ranging from 280 nm to 320 nm, and the light in the deep ultraviolet wavelength band (UV-C) may have a peak wavelength ranging from 100 nm to 280 nm.

A stepped portion 12 may be disposed on an upper end of the cavity 11. The stepped portion 12 may be formed to extend outward from an upper end of a sidewall of the cavity 11.

The light transmitting member 50 may be disposed on the stepped portion 12. Any material may be used for the light transmitting member 50 without particular limitation as long as the material is capable of transmitting light in an ultraviolet wavelength band. For example, the light transmitting member 50 may include an optic material such as quartz having a high light transmittance in an ultraviolet wavelength but is not limited thereto.

A material of a second insulating portion 41 may be the same as that of the first insulating portion 42 but is not necessarily limited thereto. The material of each of the first insulating portion 42 and the second insulating portion 41 may be selected from among an EMC, white silicone, a PSR, a silicone resin composition, a modified epoxy resin composition such as a silicone modified epoxy resin, a modified silicone resin composition such as an epoxy modified silicone resin, a polyimide resin composition, a modified polyimide resin composition, PPA, a resin such as polycarbonate resin, PPS, an LCP, an ABS resin, a phenol resin, an acrylic resin, a PBT resin, and the like.

According to the embodiment, since the second insulating portion 41 is disposed at a lower corner of the body 10, burrs are prevented from being generated at the corner during cutting of the package. In the case of an aluminum substrate, since the aluminum substrate includes a metal material, burrs may be generated while the aluminum substrate is diced into a plurality of bodies. In a case in which the burrs are generated, since a lower surface of the body is not flat, mounting the body on a circuit board may fail. In addition, in a case in which the burrs are generated, a thickness may be non-uniform, some regions may be delaminated, and thus a measurement error may also occur. Since the second insulating portion 41 is manufactured of an insulating material, the burrs may not be easily generated during the cutting.

Referring to FIG. 2, the stepped portion 12 may include a bottom surface 15, in which the cavity is formed at a center thereof, and a plurality of side surfaces connected to the bottom surface 15.

The cavity 11 may be formed at the center of the bottom surface 15 of the stepped portion 12. That is, the bottom surface 15 of the stepped portion 12 may have a quadrilateral ring shape. The bottom surface 15 may include a first bottom surface 15a and a third bottom surface 15c which are spaced apart from each other in a first direction (Y-axis direction), a second bottom surface 15b and a fourth bottom surface 15d which are spaced apart from each other with respect to a second direction (X-axis direction) perpendicular to the first direction, a first connecting portion 15e in which the first bottom surface 15a and the second bottom surface 15b are connected to each other, a second connecting portion 15f in which the second bottom surface 15b and the third bottom surface 15c are connected to each other, a third connecting portion 15g in which the third bottom surface 15c and the fourth bottom surface 15d are connected to each other, and a fourth connecting portion 15h in which the fourth bottom surface 15d and the first bottom surface 15a are connected to each other. The first to fourth connecting portions 15e, 15f, 15g, and 15h may be defined as regions in which ends of the bottom surfaces 15a, 15b, 15c, and 15d overlap each other. For example, a width of the first connecting portion 15e in the first direction may be the same as that of the second bottom surface 15b in the first direction, and a width of the first connecting portion 15e in the second direction may be the same as that of the first bottom surface 15a in the second direction.

An adhesive layer 70 may include first to fourth edge portions 71, 72, 73, and 74 disposed on the first to fourth connecting portions 15e, 15f, 15g, and 15h and a plurality of extending portions 75, 76, 77, and 78 which connect the edge portions which are adjacent to each other. For example, the plurality of extending portions may include the first extending portion 76 disposed between the first edge portion 71 and the second edge portion 72, the second extending portion 77 disposed between the second edge portion 72 and the third edge portion 73, the third extending portion 78 disposed between the third edge portion 73 and the fourth edge portion 74, and the fourth extending portion 75 disposed between the fourth edge portion 74 and the first edge portion 71.

A width of each of the plurality of extending portions 75, 76, 77, and 78 may be decreased in a direction away from the adjacent edge portions. For example, the width of the first extending portion 76 may be decreased in a direction toward a center between the first edge portion 71 and the second edge portion 72. In a case in which the width of the first extending portion 76 is sufficiently decreased, heat (HT) in the cavity may be transferred to the outside through the first extending portion 76. Accordingly, heat dissipation performance of the package may be improved.

The bottom surface 15 of the stepped portion 12 may include an outer edge P1 in which the bottom surface 15 is connected to a side surface of the stepped portion 12 and an inner edge P2 in which the bottom surface 15 is connected to a sidewall of the cavity 11.

The plurality of extending portions 75, 76, 77, and 78 may be concavely formed from the outer edge P1 or the inner edge P2 toward centers between the edge portions. That is, the plurality of extending portions 75, 76, 77, and 78 may be spaced further apart from the outer edge P1 or the inner edge P2 in a direction toward the centers of the edge portions. However, the plurality of extending portions 75, 76, 77, and 78 are not necessarily limited thereto and may also be concavely formed with respect to the outer edge P1 and the inner edge P2.

Referring to FIG. 3, in a case in which the adhesive layer 70 is applied on an entity of a portion W1 in which a light transmitting substrate overlaps a stepped surface, most heat generated in cavity may not pass through the adhesive layer 70. Accordingly, there is a problem of relying on only heat dissipation performance of the body itself. Conversely, according to the embodiment, a width of a part of the adhesive layer 70 may be decreased to serve a heat dissipation function.

Figure 4:
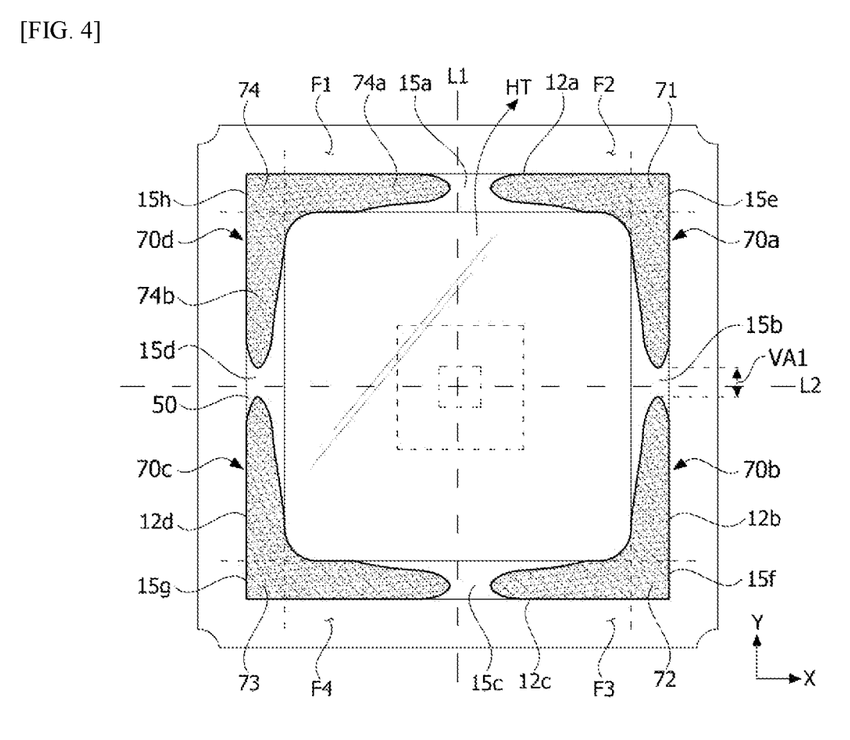
FIG. 4 is a plan view illustrating a semiconductor device package according to a second embodiment of the present disclosure.
Figure 5A:
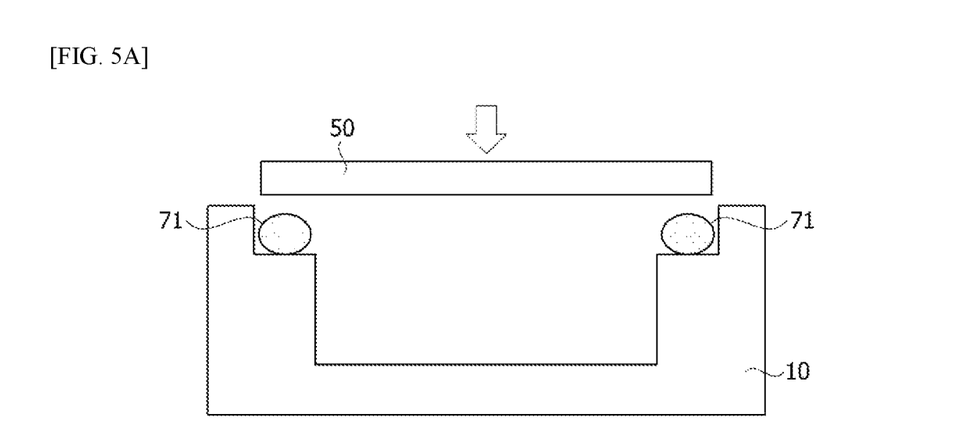
FIGS. 5A and 5B are views for describing a problem in which an adhesion failure of a light transmitting member occurs due to internal air pressure.
Figure 5B:
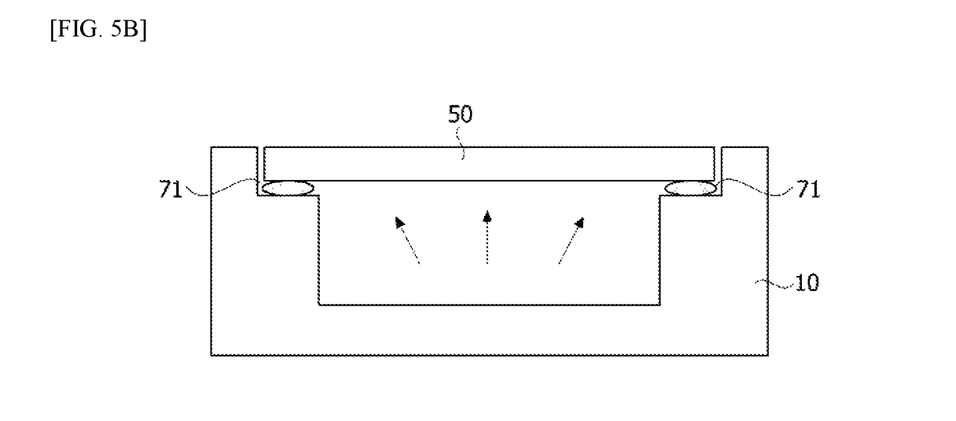
Figure 6:
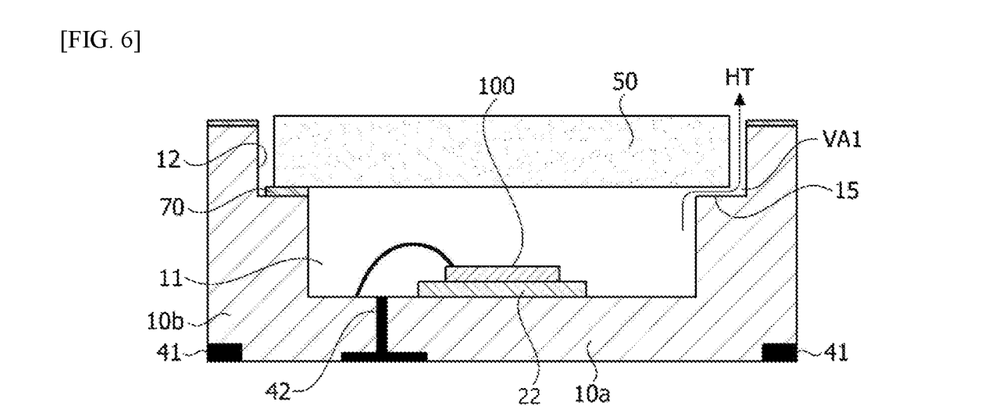
FIG. 6 is a cross-sectional view illustrating the semiconductor device package according to the second embodiment of the present disclosure.

FIG. 4 is a plan view illustrating a semiconductor device package according to a second embodiment of the present disclosure, FIGS. 5A and 5B are views for describing a problem in which an adhesion failure of a light transmitting member occurs due to internal air pressure, and FIG. 6 is a cross-sectional view illustrating the semiconductor device package according to the second embodiment of the present disclosure;

Referring to FIG. 4, adhesive layers 70 may include a separation section VA1 which is formed at least one of positions between a first edge portion 71 and a second edge portion 72, between a second edge portion 72 and a third edge portion 73, between a third edge portion 73 and a fourth edge portion 74, and between a fourth edge portion 74 and a first edge portion 71. According to such a configuration, since heat or gas in a cavity can be transferred to the outside through the separation section VA1, heat dissipation performance can be improved.

A stepped portion 12 may include a first side surface 12a and a third side surface 12c which face each other, a second side surface 12b and a fourth side surface 12d which face each other, and a plurality of divided regions F1 to F4 which are divided by a first virtual line L1 passing through a center of the first side surface 12a and a center of the third side surface 12c and a second virtual line L2 passing through a center of the second side surface 12b and a center of the fourth side surface 12d.

The divided regions F1 to F4 may include the first divided region F1 including the first side surface 12a and the second side surface 12b, the second divided region F2 including the second side surface 12b and the third side surface 12c, the third divided region F3 including the third side surface 12c and the fourth side surface 12d, and the fourth divided region F4 including the fourth side surface 12d and the first side surface 12a.

The adhesive layers 70 may include first to fourth adhesive layers 70a, 70b, 70c, and 70d which are divided from each other, the first adhesive layer 70a may be disposed in the first divided region F1, the second adhesive layer 70b may be disposed in the second divided region F2, the third adhesive layer 70c may be disposed in the third divided region F3, and the fourth adhesive layer 70d may be disposed in the fourth divided region F4.

That is, the first to fourth adhesive layers 70a, 70b, 70c, and 70d may be disposed to be spaced apart from each other in the divided regions F1 to F4. Accordingly, the heat (HT) in the cavity may be rapidly dissipated through the separation section VA1 disposed between the adhesive layers 70.

Referring to FIG. 5A, in a case in which a light transmitting member 50 is disposed on the stepped portion 12 without a dissipation groove structure, internal air pressure may be increased due to an increase in an amount of air compressed in the cavity 11. Accordingly, since a force which pushes the light transmitting member 50 upward is increased due to the increase in the amount of internal compressed air as described in FIG. 5B, a problem may occur in which the light transmitting member 50 is not bonded at an initial insertion position of the light transmitting member 50. Accordingly, an adhesion failure may occur. The adhesion failure may include a failure in which the light transmitting member 50 is obliquely bonded thereto. However, referring to FIG. 6, the semiconductor device package according to the embodiment may maintain an internal pressure of the cavity because heat or gas is transferred through the separation section VA1 between the adhesive layers 70.

Figure 7A:
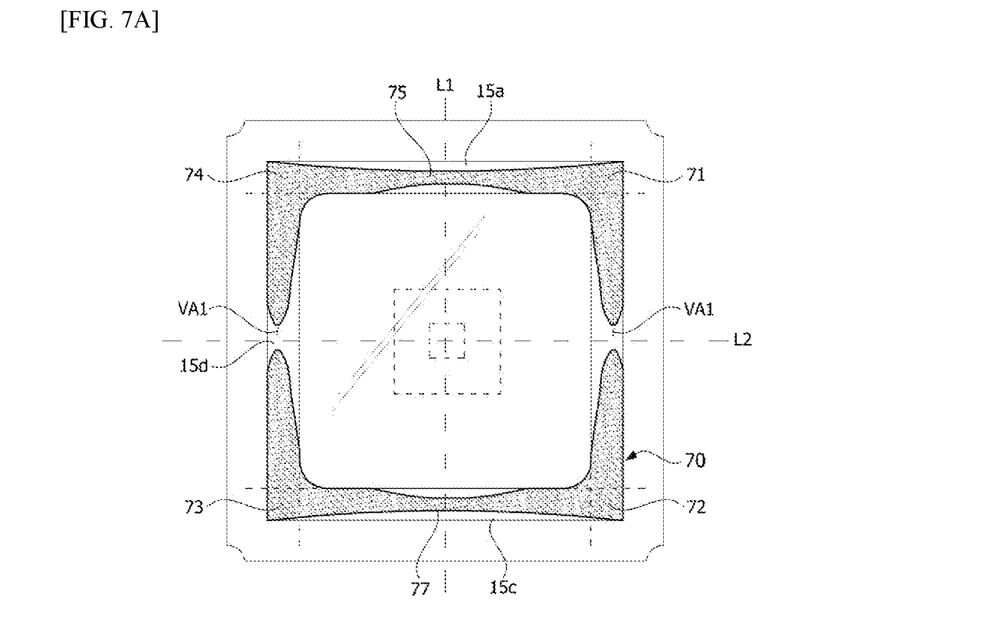
FIG. 7A is a plan view illustrating a semiconductor device package according to a third embodiment of the present disclosure.
Figure 7B:
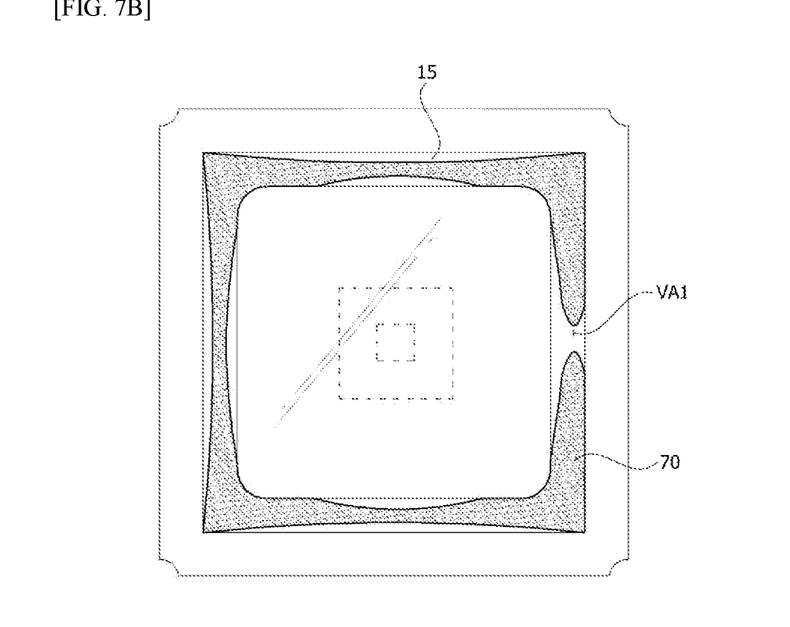
FIG. 7B is a plan view illustrating a semiconductor device package according to a fourth embodiment of the present disclosure.

FIG. 7A is a plan view illustrating a semiconductor device package according to a third embodiment of the present disclosure, and FIG. 7B is a plan view illustrating a semiconductor device package according to a fourth embodiment of the present disclosure.

The number of separation sections VA1 between adhesive layers is not particularly limited. Referring to FIG. 7A, a fourth edge portion 74 and a first edge portion 71 are connected by a extending portion 75, but a separation section VA1 may be disposed between the fourth edge portion 74 and a third edge portion 73. Alternatively, as illustrated in FIG. 7B, adhesive layers are entirely connected, but only a partial section VA1 may be disconnected.

Figure 8A:
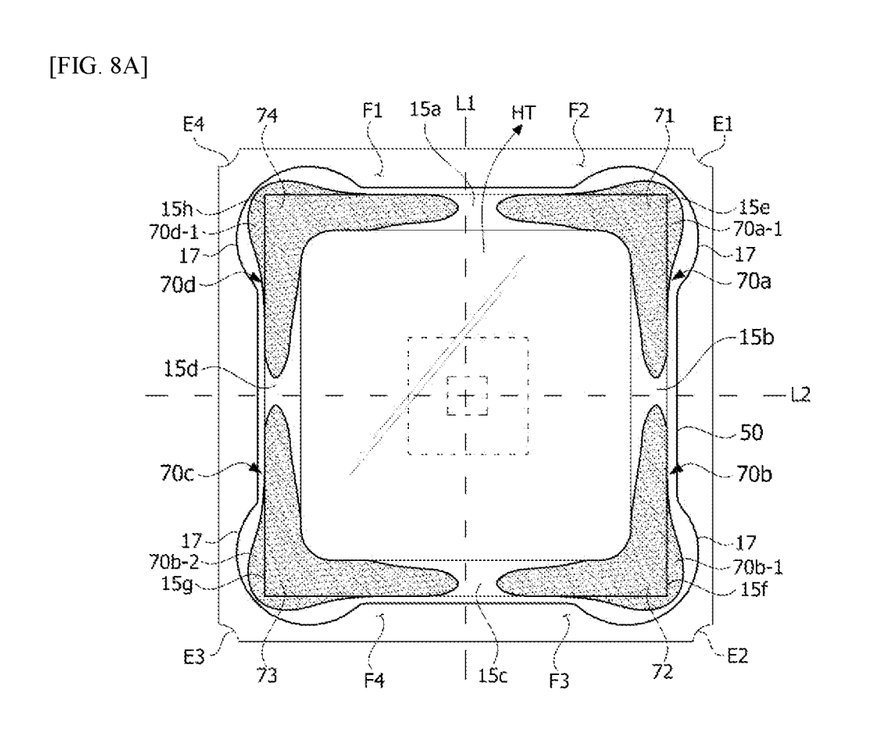
FIG. 8A is a plan view illustrating a semiconductor device package according to a fifth embodiment of the present disclosure.
Figure 8B:
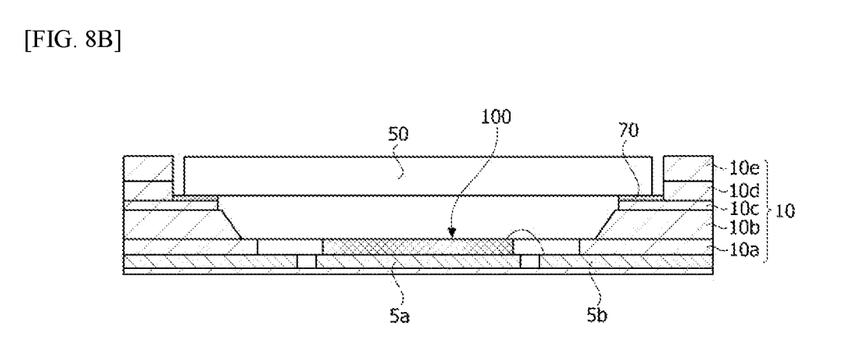
FIG. 8B is a plan view illustrating a semiconductor device package according to a sixth embodiment of the present disclosure.

FIG. 8A is a plan view illustrating a semiconductor device package according to a fifth embodiment of the present disclosure, and FIG. 8B is a plan view illustrating a semiconductor device package according to a sixth embodiment of the present disclosure.

Referring to FIG. 8A, a stepped portion 12 may include a plurality of recesses 17 which extend toward a plurality of corners E1, E2, E3, and E4 disposed between side surfaces of a body. In a case in which a light transmitting member 50 has a quadrilateral shape in which the corners E1, E2, E3, and E4 do not have a curvature, the plurality of recesses 17 may be formed by considering tolerances. In a case in which the plurality of recesses 17 are not present and the light transmitting member 50 rotates in a clockwise or counterclockwise direction, the light transmitting member 50 may not be inserted into the stepped portion 12. However, in a case in which the plurality of recesses 17 are formed, the light transmitting member 50 may be inserted into the stepped portion 12 even when rotated to some extent.

Here, an adhesive layer may include outer side portions 70a-1, 70b-1, 70c-1, and 70d-1 which extend from between the stepped portion 12 and the light transmitting member 50 toward the recesses 17. A part of the adhesive layer may be exposed to the outside of the light transmitting member 50 in a process in which an adhesive member having a dot shape is applied on regions of the recesses 17 and the light transmitting member 50 is disposed thereon.

Referring to FIG. 8B, a body 10 may include a plurality of insulating layers 10a to 10e. The plurality of insulating layers 10a to 10e include a ceramic material, and the ceramic material may include a low temperature co-fired ceramic (LTCC) or a high temperature co-fired ceramic (HTCC).

The body 10 may include metal patterns 5a and 5b formed on at least one of an upper surface and a lower surface of an arbitrary insulating layer and connecting electrodes which vertically pass through the insulating layers and are selectively connected to the metal patterns. The connecting electrode includes a via or via hole but is not limited thereto.

As another example, the plurality of insulating layers 10a to 10e may include an insulating member such as a nitride or an oxide and may preferably include a metal nitride having a thermal conductivity higher than that of the oxide or nitride. For example, a material of the body 10 may be $SiO_2$, $Si_xO_y$, $Si_3N_4$, $Si_xN_y$, $SiO_xN_y$, $Al_2O_3$, or AlN and may be a metal nitride having a thermal conductivity of 140 W/m·K, but is not necessarily limited thereto.

Thicknesses of layers of the body 10 may be the same, or at least one thickness thereof may be different from those of the remaining thicknesses, but the present disclosure is not limited thereto. The insulating layers of the body 10 are individual layers which are stacked thereon through a manufacturing process, and may also be integrally formed after firing.

All of the above-described features may be applied to an adhesive layer 70 which fixes a light transmitting member 50.

Figure 9:
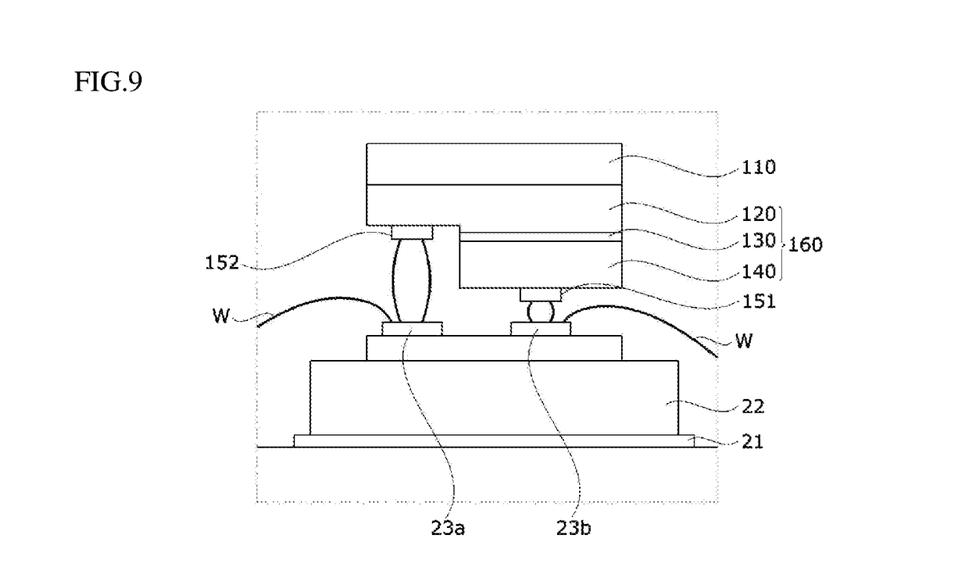
FIG. 9 is a conceptual view illustrating a semiconductor device.
Figure 10:
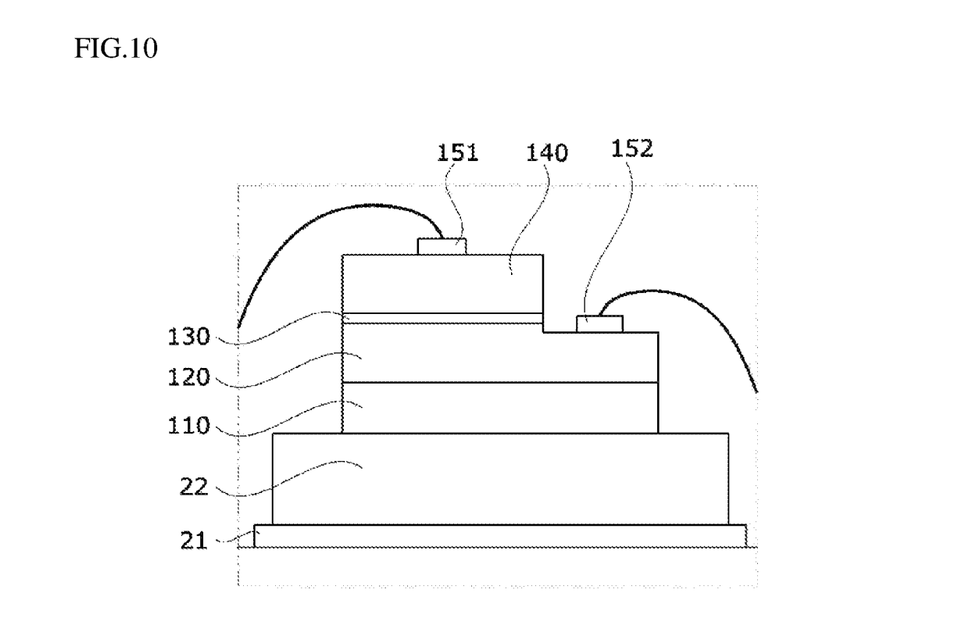
FIG. 10 is a view illustrating a modified example of FIG. 9.

FIG. 9 is a conceptual view illustrating a semiconductor device, and FIG. 10 is a view illustrating a modified example of FIG. 9.

Referring to FIG. 9, a semiconductor device 100 according to the embodiment may be mounted on a submount 22 in a flip chip manner. That is, a first electrode 152 and a second electrode 151 of the semiconductor device 100 may be mounted on a first pad 23a and a second pad 23b of the submount 22 in a flip chip manner. Here, the first pad 23a and the second pad 23b may be soldered to bodies 10a and 10b with wires W.

However, a method of mounting the semiconductor device 100 is not particularly limited. For example, as illustrated in FIG. 10, a substrate 110 of a semiconductor device 100 is disposed on a submount 22, and a first electrode 152 and a second electrode 151 may also be directly soldered to bodies 10a and 10b.

The semiconductor device 100 according to the embodiment may include the substrate 110, a first conductive semiconductor layer 120, an active layer 130, and a second conductive semiconductor layer 140. The semiconductor layers may include an aluminum composition so as to emit light in an ultraviolet wavelength band.

The substrate 110 includes a conductive substrate or an insulating substrate. The substrate 110 may be a material or carrier wafer suitable for semiconductor material growth. The substrate 110 may be formed of a material selected from among sapphire ($Al_2O_3$), SiC, GaAs, GaN, ZnO, Si, GaP, InP, and Ge but is not limited thereto. As necessary, the substrate 110 may be removed.

A buffer layer (not shown) may be further provided between the first conductive semiconductor layer 120 and the substrate 110. The buffer layer may relax lattice mismatch between a light-emitting structure 160 provided on the substrate 110 and the substrate 110.

The first conductive semiconductor layer 120 may be formed of a III-V or II-VI compound semiconductor or the like and may be doped with a first dopant. The first conductive semiconductor layer 120 may be selected from among semiconductor materials having a composition formula of $In_{x1}Al_{y1}Ga_{1-x1-y1}N$ ($0 \le x1 \le 1$, $0 < y1 \le 1$, $0 \le x1+y1 \le 1$), for example, AlGaN, AlN, and InAlGaN. In addition, the first dopant may be an N-type dopant such as Si, Ge, Sn, Se, and Te. In a case in which the first dopant is the N-type dopant, the first conductive semiconductor layer 120 doped with the first dopant may be an N-type semiconductor layer.

The active layer 130 is a layer in which electrons (or holes) injected through the first conductive semiconductor layer 120 meet holes (or electrons) injected through the second conductive semiconductor layer 140. As the electrons and the holes are recombined and transit to a low energy level, the active layer 130 may generate light having a corresponding wavelength.

The active layer 130 may have one structure among a single well structure, a multi well structure, a single quantum well structure, a multi quantum well (MQW) structure, a quantum dot structure, and a quantum line structure, but the structure of the active layer 130 is not limited thereto.

The second conductive semiconductor layer 140 is formed on the active layer 130 and may be formed of a III-V or II-VI compound semiconductor, and the second conductive semiconductor layer 140 may be doped with a second dopant. The second conductive semiconductor layer 140 may be formed of a semiconductor material having a composition formula of $In_{x5}Al_{y2}Ga_{1-x5-y2}N$ ($0 \le x5 \le 1$, $0 < y2 \le 1$, $0 \le x5+y2 \le 1$) or a material selected from among AlInN, AlGaAs, GaP, GaAs, GaAsP, and AlGaInP. In a case in which the second dopant is a P-type dopant such as Mg, Zn, Ca, Sr, and Ba, the second conductive semiconductor layer 123 doped with the second dopant may be a P-type semiconductor layer.

The first electrode 152 may be electrically connected to the first conductive semiconductor layer 120, and the second electrode 151 may be electrically connected to the second conductive semiconductor layer 140. A material of each of the first and second electrodes 152 and 151 may be selected from among Ti, Ru, Rh, Ir, Mg, Zn, Al, In, Ta, Pd, Co, Ni, Si, Ge, Ag, Au, and an alloy selected therefrom.

The embodiment has been described with reference to a structure of a horizontal type light-emitting device but is not necessarily limited thereto. For example, a light-emitting device according to the embodiment may also have a vertical structure or a flip chip structure.

Figure 11A:
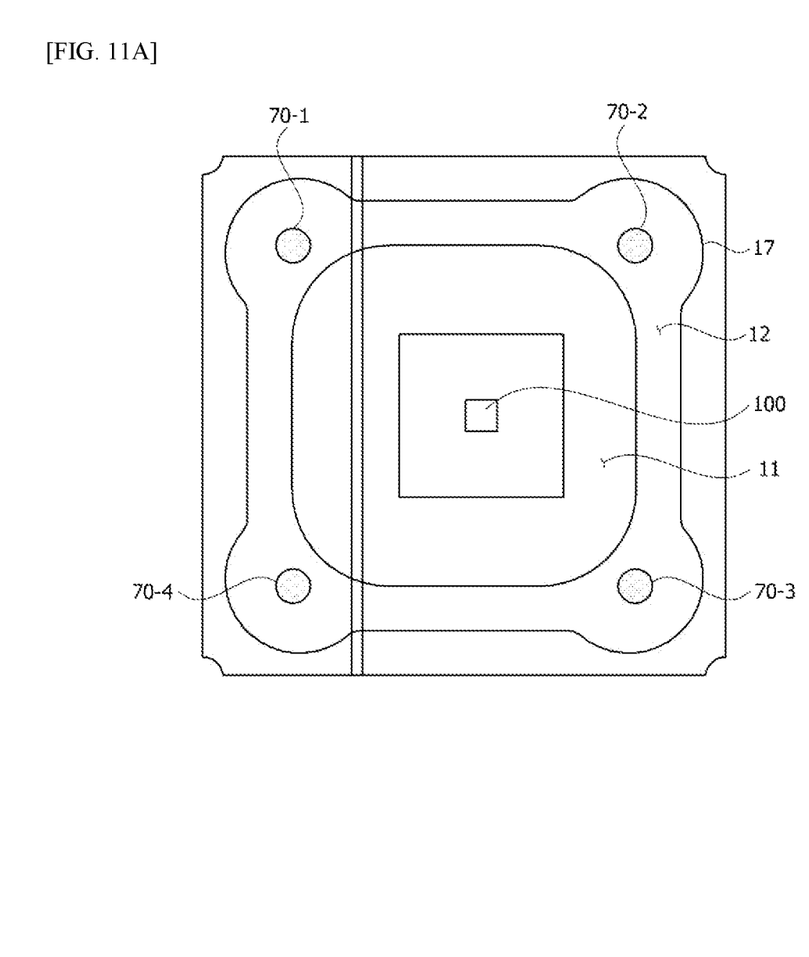
FIGS. 11A and 11B are views showing a method of bonding a light transmitting member to a package.
Figure 11B:
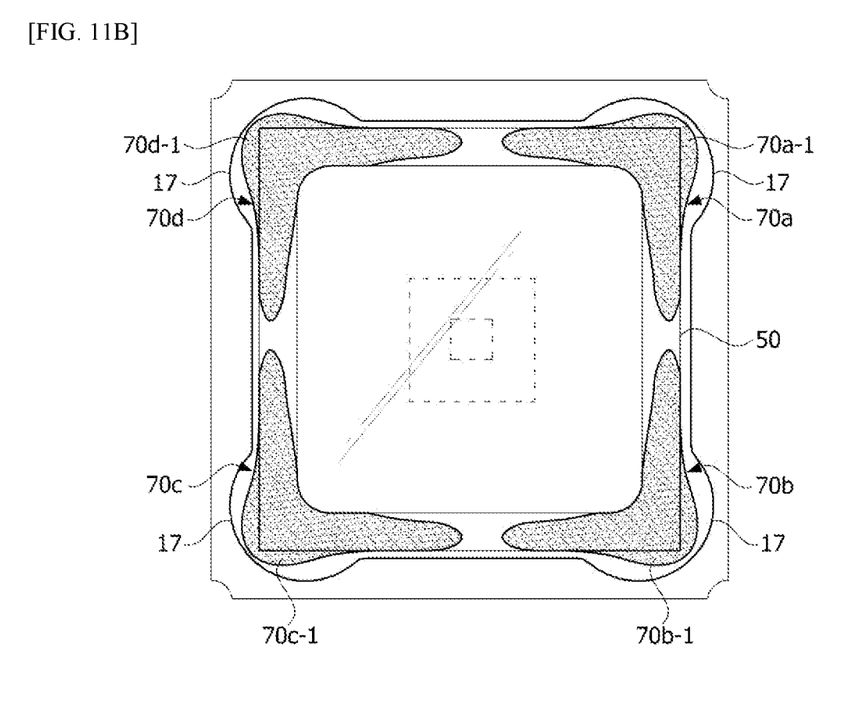

FIGS. 11A and 11B are views showing a method of bonding a light transmitting member to a package.

Referring to FIG. 11A, adhesives 70-1 to 70-4 may be applied to a stepped portion 12. The adhesives 70-1 to 70-4 may also be partially applied to recesses 17 of the stepped portion 12. The adhesives 70-1 to 70-4 applied to the recesses 17 may be gradually spread on a bottom surface of the stepped portion 12. Here, in order to form a separation section on an adhesive layer, an amount of any one among applied adhesives 70-1 to 70-4 may be adjusted to be decreased. Alternatively, a dam structure may also be formed in a partial area of the bottom surface such that the adhesive is not spread.

The adhesives 70-1 to 70-4 may be one or more among epoxy resin, silicon resin, polyimide resin, urea resin, and acryl resin. As an example, the adhesives 70-1 to 70-4 may be silicon resin or epoxy resin. However, the adhesives are not limited thereto and may be selected from materials capable of fixing a light transmitting member to a body.

Referring to FIG. 11B, a light transmitting member 50 may be fixed by a plurality of adhesive layers 70a to 70d when being inserted into the stepped portion 12. Here, heat in a cavity may be transferred through separation spaces between the adhesive layers 70a to 70d.

The semiconductor device may be applied to various kinds of light source devices. For example, the light source devices may include sterilizers, curing devices, lighting devices, display devices, vehicle lamps, and the like. That is, the semiconductor device may be disposed in a case and applied to various electronic devices configured to provide light.

The sterilizer may include the semiconductor device according to the embodiment to sterilize a desired region. The sterilizer may be applied to home appliances such as a water purifier, an air conditioner, and a refrigerator but is not limited thereto. That is, the sterilizer may be applied to all various apparatuses (for example, a medical device) which need sterilizing.

For example, the water purifier may include the sterilizer according to the embodiment so as to sterilize circulating water. The sterilizer may be disposed at a nozzle through which water circulates or a discharging port to emit ultraviolet light. Here, the sterilizer may include a water proof structure.

The curing device may include the semiconductor device according to the embodiment to cure various kinds of liquids. The liquids may include all materials which are cured when exposed to ultraviolet light. For example, the curing device may cure various kinds of resins. In addition, the curing device may also be applied to cure a cosmetic product such as nail polish.

The lighting device may include a substrate, a light source module having the semiconductor device according to the embodiment, a radiator configured to radiate heat of the light source module, and a power source configured to process or convert an externally received electric signal to provide the electric signal to the light source module. In addition, the lighting device may include a lamp, a head lamp, a street light, or the like.

The display device may include a bottom cover, a reflective plate, a light-emitting module, a light guide plate, an optical sheet, a display panel, an image signal output circuit, and a color filter. A backlight unit may be formed of the bottom cover, the reflective plate, the light-emitting module, the light guide plate, and the optical sheet.

The reflective plate may be disposed above the bottom cover, and the light-emitting module may emit light. The light guide plate may be disposed in front of the reflective plate to guide the light emitted by the light-emitting module in a forward direction. The optical sheet may include a prism sheet and the like and may be disposed in front of the light guide plate. The display panel may be disposed in front of the optical sheet, the image signal output circuit may send an image signal to the display panel, and the color filter may be disposed in front of the display panel.

When the semiconductor device is used for the backlight unit of the display device, the semiconductor device may be used for an edge type backlight unit or direct type backlight unit.

According to the embodiments of the present disclosure, heat dissipation efficiency of a semiconductor device package can be improved.

In addition, since internal air pressure can be adjusted, an adhesion failure of a light transmitting member can be solved.

Various useful advantages and effects of the present disclosure are not limited to the above-described advantages, and may be understood in a process in which specific embodiments are described.

The embodiments have been particularly described but are only examples and are not to limit the present disclosure. It will be understood by those skilled in the art that various changes and applications that are not illustrated above will be made within a range without departing from the essential characteristics of the present disclosure. For example, the components specifically described in the embodiments may be changed. In addition, it should be interpreted that differences related to the changes and applications fall within the scope of the present disclosure defined by the appended claims.

What is claimed is:

1. A semiconductor device package comprising:
a body including a cavity;
a semiconductor device disposed in the cavity;
a light transmitting member disposed on the cavity; and
an adhesive layer which fixes the light transmitting member to the body,
wherein the cavity includes a stepped portion on which the light transmitting member is disposed,
the stepped portion includes a first bottom surface and a third bottom surface spaced apart from each other in a first direction, a second bottom surface and a fourth bottom surface spaced apart from each other in a second direction perpendicular to the first direction, a first connecting portion in which the first bottom surface and the second bottom surface are connected to each other, a second connecting portion in which the second bottom surface and the third bottom surface are connected to each other, a third connecting portion in which the third bottom surface and the fourth bottom surface are connected to each other, and a fourth connecting portion in which the fourth bottom surface and the first bottom surface are connected to each other,
the adhesive layer includes a first edge portion, a second edge portion, a third edge portion, and a fourth edge portion respectively disposed on the first to fourth connecting portions and a first extending portion disposed between the first edge portion and the second edge portion, and
the first extending portion has a width which is decreased in a direction from the first edge portion toward a center between the first edge portion and the second edge portion,
wherein the adhesive layer includes at least one of separation sections which is formed at least one of center positions between the first edge portion and the second edge portion, between the second edge portion and the third edge portion, between the third edge portion and the fourth edge portion, and between the fourth edge portion and the first edge portion.

2. The semiconductor device package of claim 1, wherein:
the first to fourth bottom surfaces include outer edges formed by a side surface of the stepped portion and inner edges formed by a sidewall of the cavity; and
the first extending portion is spaced apart from the outer edge or the inner edge in a direction toward the center between the first edge portion and the second edge portion.

3. The semiconductor device package of claim 1, wherein:
the stepped portion includes a first side surface and a third side surface which face each other, a second side surface and a fourth side surface which face each other, and a plurality of divided regions divided by a first virtual line which passes through a center of the first side surface and a center of the third side surface and a second virtual line which passes through a center of the second side surface and a center of the fourth side surface;
the divided regions include a first divided region including the first side surface and the second side surface, a second divided region including the second side surface and the third side surface, a third divided region including the third side surface and the fourth side surface, and a fourth divided region including the fourth side surface and the first side surface; and
the adhesive layer includes a first adhesive layer, a second adhesive layer, a third adhesive layer, and a fourth adhesive layer which are divided from each other,
wherein the first adhesive layer is disposed in the first divided region, the second adhesive layer is disposed in the second divided region, the third adhesive layer is disposed in the third divided region, and the fourth adhesive layer is disposed in the fourth divided region.

4. The semiconductor device package of claim 1, wherein the stepped portion includes a recess which extends toward a corner disposed between side surfaces of the body.

5. The semiconductor device package of claim 4, wherein the adhesive layer includes an outer side portion which extends from a portion between the stepped portion and the light transmitting member toward the recess.

6. The semiconductor device package of claim 1, wherein the body includes:
a first conductive portion;
a second conductive portion; and
a first insulating portion disposed between the first conductive portion and the second conductive portion.

7. The semiconductor device package of claim 6, wherein the first conductive portion and the second conductive portion include Aluminum.

8. The semiconductor device package of claim 6, wherein a width of the first insulating portion is in a range of 10 μm to 100 μm.

9. The semiconductor device package of claim 6, wherein the body includes a second insulating portion disposed in a region formed by a lower surface and a side surface of the body.

10. The semiconductor device package of claim 9, wherein a material of the first insulating portion is the same as a material of the second insulating portion.

11. The semiconductor device package of claim 9, wherein the semiconductor device generates ultraviolet light.

12. The semiconductor device package of claim 1, wherein the body includes a plurality of insulating layers.

13. The semiconductor device package of claim 12, wherein the plurality of insulating layer includes one of $SiO_2$, $SixOy$, $Si_3N_4$, $SixNy$, $SiOxNy$, $Al_2O_3$, or AlN.

14. The semiconductor device package of claim 1, further comprising a sub-mount disposed in the cavity, wherein the semiconductor device is disposed on the sub-mount.

15. The semiconductor device package of claim 14, further comprising a wire connecting the semiconductor device and the body.

16. The semiconductor device package of claim 1, wherein the light transmitting member transmits light in an ultraviolet wavelength band.

17. The semiconductor device package of claim 1, wherein the semiconductor device includes a first conductive semiconductor layer, an active layer, and a second conductive semiconductor layer.

18. The semiconductor device package of claim 17, wherein the active layer generates ultraviolet light.

19. The semiconductor device package of claim 17, wherein heat or gas in the cavity is transferred to the outside through the separation section.

\* \* \* \* \*